United States Patent
Pfirsch et al.

(10) Patent No.: US 6,320,205 B1
(45) Date of Patent: Nov. 20, 2001

(54) EDGE TERMINATION FOR A SEMICONDUCTOR COMPONENT, A SCHOTTKY DIODE HAVING AN EDGE TERMINATION, AND A METHOD FOR PRODUCING THE SCHOTTKY DIODE

(75) Inventors: Frank Pfirsch, München; Roland Rupp, Lauf, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/663,570

(22) Filed: Sep. 15, 2000

Related U.S. Application Data

(63) Continuation of application No. PCT/DE00/00024, filed on Jan. 3, 2000.

(30) Foreign Application Priority Data

Jan. 15, 1999 (DE) .............................................. 199 01 385

(51) Int. Cl.[7] ...................... H01L 31/0312; H01L 27/095

(52) U.S. Cl. ............................ 257/77; 257/472; 257/476; 257/481; 257/485; 257/603; 257/653

(58) Field of Search ............................. 257/77, 472, 476, 257/481, 483, 485, 603, 613, 653

(56) References Cited

U.S. PATENT DOCUMENTS

| | | | |
|---|---|---|---|
| 5,486,718 | * | 1/1996 | Robb et al. ............................. 257/630 |
| 5,780,996 | * | 7/1998 | Kusase et al. ........................... 322/28 |
| 5,789,311 | * | 8/1998 | Ueno et al. ............................. 438/573 |

* cited by examiner

*Primary Examiner*—Minh Loan Tran
(74) *Attorney, Agent, or Firm*—Herbert L. Lerner; Laurence A. Greenberg; Werner H. Stemer

(57) ABSTRACT

An edge termination for a semiconductor component containing a semiconductor body formed of silicon carbide. The edge termination has at least one diode chain that is insulated from the semiconductor body and provided with a plurality of semiconductor layers having alternating conductivity types.

18 Claims, 5 Drawing Sheets

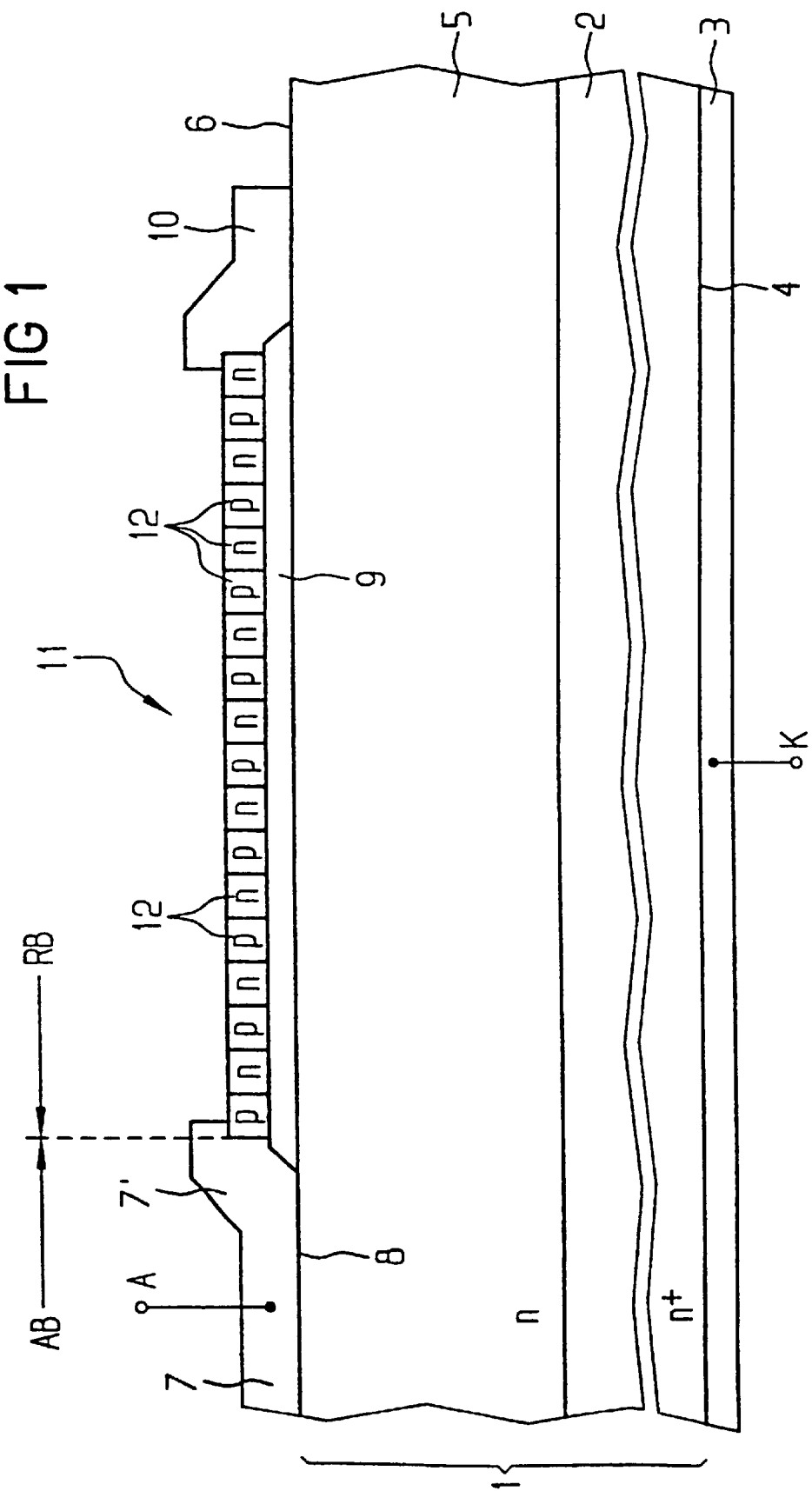

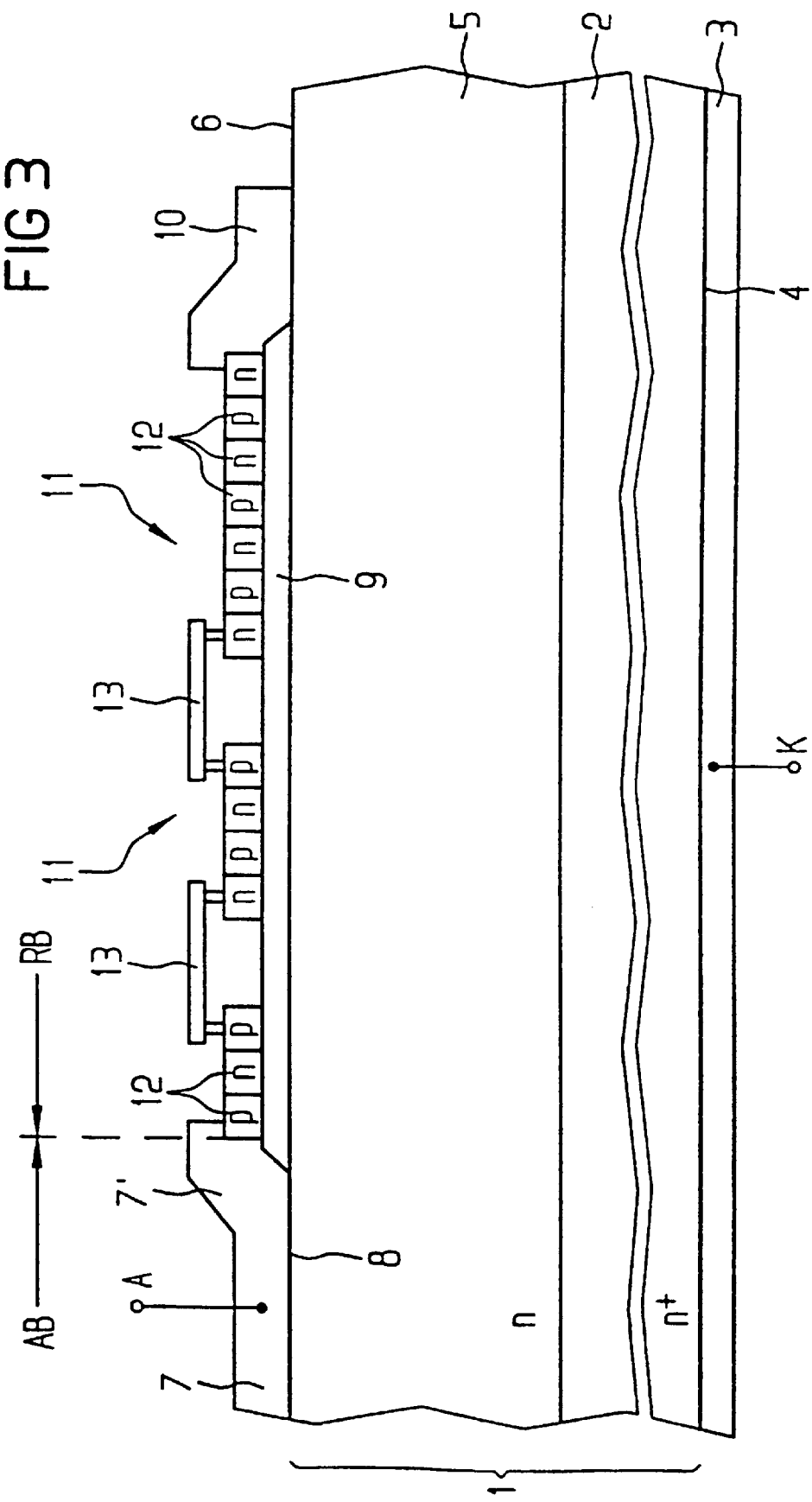

US 6,320,205 B1

EDGE TERMINATION FOR A SEMICONDUCTOR COMPONENT, A SCHOTTKY DIODE HAVING AN EDGE TERMINATION, AND A METHOD FOR PRODUCING THE SCHOTTKY DIODE

CROSS-REFERENCE TO RELATED APPLICATION

This is a continuation of copending International Application PCT/DE00/00024, filed Jan. 3, 2000, which designated the United States.

BACKGROUND OF THE INVENTION

Field of the Invention

The present invention relates to an edge termination for a semiconductor component formed of silicon carbide and to a Schottky diode having an edge termination. The present invention also relates to a method for producing a semiconductor component having such an edge termination.

The invention relates predominantly to asymmetrically blocking semiconductor components having planar edge terminations. The invention relates in particular to semiconductor components in the form of Schottky diodes. Such semiconductor components and their method of operation have been known for a long time and require no further description.

In semiconductor components of such a type, in particular in the case of high-voltage-resistant power semiconductor components, voltage breakdowns preferably occur in the edge area, since the electrical field strength there is particularly large owing to the curvature of the doped regions as a result of the edge. In order to avoid such voltage breakdowns, edge terminations are provided, which are disposed in the form of rings and typically completely enclose the semiconductor component. The edge terminations weaken or reduce local field strength peaks in the edge area of the semiconductor component. Undesirable voltage breakdowns in the edge area can thus be avoided, and the semiconductor component remains serviceable. A large number of different edge terminations for semiconductor components are described in a reference by B. J. Baliga, titled "Modern Power Devices", John Wiley and Sons, 1987.

Furthermore, U.S. Pat. No. 5,486,718 describes edge terminations in which chains of zener diodes containing polysilicon are disposed in a spiral shape in the edge area. These zener diodes are intended to control the potential profile of the electrical field in the edge area.

On page 437 of the reference titled "Modern Power Devices", mentioned above, edge terminations for Schottky diodes are described. Here, one of the edge terminations is in the form of a guard ring that surrounds the Schottky contact and forms a pn-junction with the remaining semiconductor region. Alternatively, the Schottky contact can also be provided directly with an edge termination formed from field plates, that is to say without a pn-junction.

Schottky diodes are majority-carrier semiconductor components and are thus particularly suitable for high-frequency applications, that is to say for applications which require very fast switching processes and a reverse current which is as low as possible during off-commutation. Silicon Schottky diodes are, however, limited to reverse voltages of about 100 V owing to their very large reverse current.

Thus, for these reasons, it is becoming ever more attractive to use other semiconductor materials, which do not have the disadvantages mentioned above, to produce Schottky diodes.

One such material, for example, is silicon carbide (SiC). U.S. Pat. No. 5,789,311 describes an SiC Schottky diode. SiC semiconductor components and SiC Schottky diodes have excellent electrical and physical characteristics in comparison with those semiconductor components produced from silicon, and a number of these will be described in the following text.

The breakdown field strength of SiC is greater than that of silicon by a factor of 10 to 15. Owing to the very high breakdown field strength, SiC semiconductor components can be made very small, which advantageously also results in a very low ON resistance. SiC semiconductor components thus offer a particularly good compromise between a high blocking capability and a low forward voltage.

Owing to the fact that SiC has a considerably shorter charge carrier life than silicon, SiC is particularly suitable for semiconductor components for radio-frequency applications, since considerably higher switching speeds can be achieved here. Owing to the fact that an SiC Schottky diode has virtually no minority charge carriers, the charge carriers can be depleted very quickly during off-commutation, thus making high switching speeds possible.

In comparison to silicon, SiC is thermally extremely stable-SiC has a sublimation temperature of more than 1600° C.—and its thermal conductivity is greater by a factor of 3. Particularly owing to the fact that SiC has a very wide energy gap and, associated with this, a low intrinsic concentration, SiC is particularly suitable for applications at high temperatures.

A major disadvantage of semiconductor components composed of SiC is, however, that high temperatures (>1500° C.) are typically required to heal and activate implanted doped regions, and these high temperatures generally do not allow such SiC semiconductor components to be processed in conventional workshops set up for silicon technology.

SUMMARY OF THE INVENTION

It is accordingly an object of the invention to provide an edge termination for a semiconductor component, a Schottky diode having an edge termination, and a method for producing the Schottky diode which overcomes the above-mentioned disadvantages of the prior art devices and methods of this general type, With the foregoing and other objects in view there is provided, in accordance with the invention, a semiconductor component, containing a semiconductor body formed of silicon carbide; an insulation layer disposed on the semiconductor body; and an edge termination having at least one diode chain disposed on the insulation layer and thereby being insulated from the semiconductor body. The diode chain has a large number of semiconductor layers formed of alternating conductivity types.

With the foregoing and other objects in view there is further provided, in accordance with the invention, a Schottky diode containing a semiconductor body of a first conductivity type, formed of silicon carbide, and having a first surface and a second surface. The semiconductor body has a dopant layer of the first conductivity type and a top surface of the dopant layer defines the first surface of the semiconductor body. The dopant layer has a dopant concentration lower than that of the remainder of the semiconductor body. A metallic first electrode is disposed on the first surface and forms a Schottky contact with the semiconductor body. A second electrode contacting the semiconductor body on the second surface is provided. An insulation layer is disposed on the first surface of the semiconductor body. A reference ground potential terminal is provided. An edge termination having at least one diode chain is disposed on the insulation layer and thereby is insulated from the semiconductor body. The diode chain has a large number of semiconductor layers formed of alternating conductivity types, the diode chain is connected to the first electrode and to the reference-ground potential terminal.

The present invention allows all the process steps for the production of the edge terminations for the SiC semiconductor components to be carried out at a temperature (<1250° C.) which is typical in silicon technology. These process steps can be carried out in a conventional silicon production line. In particular, SiC Schottky diodes can thus be manufactured, with the exception of the production of the basic SiC material and the production of the epitaxial layer, entirely independently of the known difficulties with SiC technology.

In accordance with an added feature of the invention, the diode chain is a single, continuous chain of mutually adjacent ones of the semiconductor layers having alternating conductivity types.

In accordance with an additional feature of the invention, at least one field plate is connected to at least one of the semiconductor layers of the diode chain.

In accordance with another feature of the invention, the semiconductor body has an active area, and the field plate is one of a plurality of field plates disposed as concentric interconnects, circular rings, around the active area of the semiconductor body.

In accordance with another feature of the invention, the semiconductor layers of the diode chain have one of an equidistant grid and a non-equidistant grid with a grid size reducing toward an edge of the semiconductor body.

In accordance with a further feature of the invention, the semiconductor layers of the diode chain form a large number of zener diodes.

In accordance with another further feature of the invention, in a lateral projection, the diode chain has at least one of a spiral and a meandering shape, and is interleaved.

In accordance with a further added feature of the invention, the semiconductor layers contain at least one of doped polysilicon and doped monocrystalline silicon.

In accordance with a further additional feature of the invention, the reference ground potential terminal is at a cathode potential of the Schottky diode.

With the foregoing and other objects in view there is further provided, in accordance with the invention, a method for producing a Schottky diode. The method includes the step of providing a semiconductor body having a first surface and a second surface. The semiconductor body has a doped layer of a first conductivity type formed using a epitaxial process and a top surface of the doped layer defines the first surface of the semiconductor body. The doped layer has a lower dopant concentration than a remainder of the semiconductor body. An oxide is applied to the first surface of the doped layer, and the oxide is structured to form an insulation layer in an edge area. Polysilicon is applied to the insulation layer in the edge area. The polysilicon is structured and implanted such that a large number of semiconductor layers having alternating conductivity types are formed. A metallization forming a Schottky contact and a first electrode is applied to the first surface. The first electrode is structured such that it is connected to at least one of the semiconductor layers. A second electrode forming a resistive contact is formed over a large area of the second surface of the semiconductor body.

In accordance with an added feature of the invention, there is the step of connecting at least one of the semiconductor layers to the semiconductor body.

In accordance with another feature of the invention, there is the step of applying a further metallization which can be soldered or bonded well and is used for contact reinforcement to at least one of the first electrode and the second electrode.

In accordance with a concomitant feature of the invention, the insulation layer has a thermally formed first oxide applied directly to the first surface of the semiconductor body, and a second oxide, produced by deposition, is applied to the first oxide.

Other features which are considered as characteristic for the invention are set forth in the appended claims.

Although the invention is illustrated and described herein as embodied in an edge termination for a semiconductor component, a Schottky diode having an edge termination, and a method for producing the Schottky diode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, partial sectional view of an SiC Schottky diode having an edge termination according to the invention, which contains a zener diode chain;

FIG. 3 is a partial sectional view of the SiC Schottky diode having the edge termination according to the invention, which contains the zener diode chain and field plates disposed in between;

FIG. 4 is a plan view of the layout of the SiC Schottky diode, in which the edge termination contains the zener diode chain with field plates disposed in between;

DESCRIPTION OF THE PREFERRED EMBODIMENTS

Figure 2A:
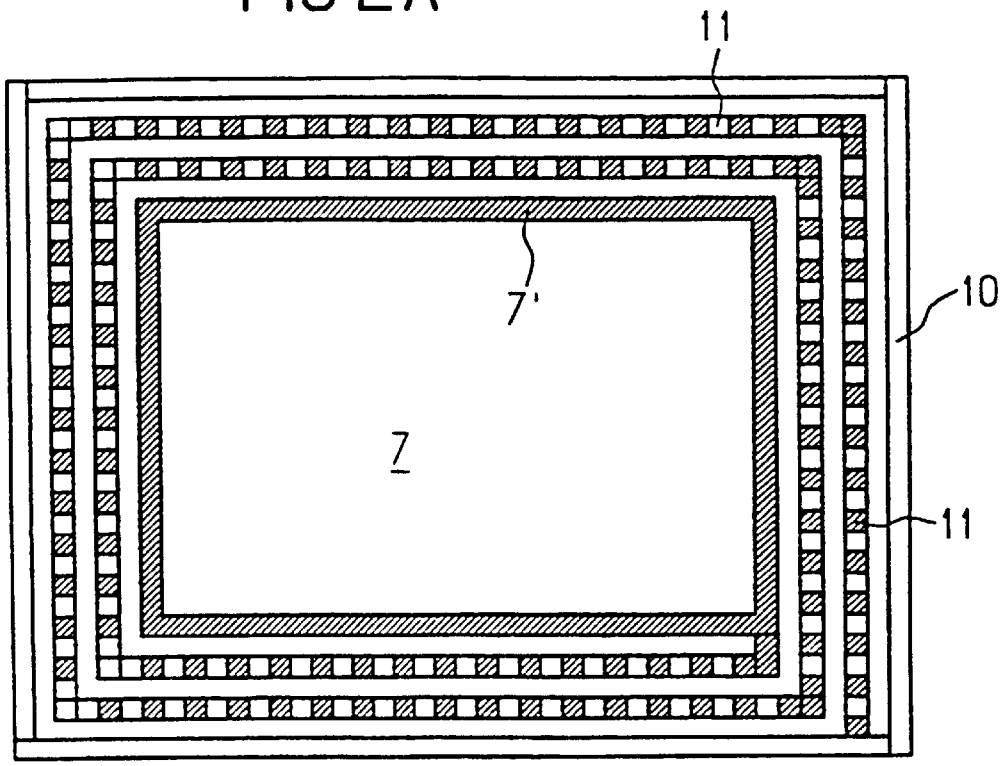
FIGS. 2A and 2B are plan views of a layout of the SiC Schottky diode, in which a single zener diode chain (FIG. 2A) and four zener diode chains (FIG. 2B), disposed in a spiral shape is or are provided in the edge area.

In all the figures of the drawing, sub-features and integral parts that correspond to one another bear the same reference symbol in each case. Referring now to the figures of the drawing in detail and first, particularly, to FIG. 1 thereof, there is shown a part of a silicon carbide (SiC) Schottky diode. However, the invention is not exclusively limited to SiC Schottky diodes but, within the scope of the invention, can also be used highly advantageously with all other SiC semiconductor components, such as pn diodes, MOSFETS, bipolar transistors or the like.

FIG. 1 shows a partial section of an edge termination of the SiC Schottky diode, in which a zener diode chain is provided for the edge termination.

The Schottky diode has an anode connection A and a cathode connection K, which are disposed on opposite sides of a semiconductor body 1.

The semiconductor body 1, which contains SiC and whose poly type will not be described in any more detail in the present exemplary embodiment and is also irrelevant to the invention, has an inner zone 2, which is heavily n-doped in the present exemplary embodiment. On the cathode side, a large-area cathode electrode 3 is applied to the inner zone 2, and thus to a rear-face surface of the semiconductor body 1. In this case, the cathode electrode 3 is connected to the cathode connection K.

A lightly n-doped epitaxial layer 5 is provided on the anode side, and is adjacent to the inner zone 2 and to a front-face surface 6 over the entire width of the semiconductor body 1. In a central area, on the front-face surface 6, the Schottky diode in FIG. 1 has an anode electrode 7 which is connected to the anode connection A. In the following text, the central area will also be referred to as active area AB of the semiconductor component. The anode electrode 7 is applied over a large area in the central area to the epitaxial layer 5 in such a way that they together form a Schottky contact 8, in a known manner. Furthermore, the anode electrode 7 is configured in such a way that it has a rising profile toward the edge, where it has the form of a field plate 7'.

The areas outside the active area AB of the Schottky diode are also referred to as an edge area RB in the following text. An insulation layer 9 that, for example, contains silicon dioxide, is provided over a large area in the edge area RB. Furthermore, the Schottky diode shown in FIG. 1 has a space charge zone stopper 10. The space charge zone stopper 10 is disposed in an outermost edge area RB of the semiconductor component, that is to say immediately in front of its sawn edge. In the present exemplary embodiment, the space charge zone stopper 10 is configured in a known manner as a substrate contact electrode 10, which rises toward the active area AB, is in the form of a single step, and typically forms a resistive contact with the substrate of the semiconductor body 1. The substrate contact electrode 10 is typically metallic, but may also be in the form of a polysilicon electrode, or may even be omitted, depending on the application.

In FIG. 1, a diode chain 11 is provided on the insulation layer 9 in the edge area RB of the semiconductor component. The diode chain 11 is in this case kept at a distance from the semiconductor body 1 via the insulation layer 9. Toward the active area AB of the semiconductor component, the diode chain 11 is connected to the anode electrode 7, and toward the edge it is connected to the substrate contact electrode 10. In the situation where the substrate contact electrode 10 has been omitted, an outermost layer 12 of the diode chain 11 may also be connected directly to the semiconductor substrate.

The diode chain 11 contains a large number of mutually adjacent semiconductor layers 12 of alternating conductivity types, with two mutually adjacent semiconductor layers 12 in each case forming a pn diode. Any desired semiconductor material, for example silicon, gallium arsenide or the like, may be chosen as the semiconductor material for the semiconductor layers 12, depending on the requirement.

In the present exemplary embodiment, the diodes in the diode chain 11 are assumed to be in the form of zener diodes.

It is particularly advantageous to configure the diode chain 11 with zener diodes since, depending on their sizes and doping concentration, zener diodes may have a breakdown voltage in the range from 6 V to 60 V. The breakdown voltage of zener diodes is generally a function of the temperature.

Particularly in the case of zener diodes, the temperature dependency of the breakdown voltage is very small, if the breakdown voltage of the respective zener diodes is chosen. Specifically, this results in that, in the transitional region between zener breakdown and avalanche breakdown, and with very low breakdown voltages, the temperature dependency can be virtually avoided, particularly with zener diodes.

In the exemplary embodiment shown in FIG. 1, the individual semiconductor layers 12 have the same width and thus form an equidistant grid. This makes it possible to ensure that the potential is reduced linearly in the semiconductor body 1. The widths of the semiconductor layers 12 need not, however, be the same. It would, of course, also be feasible for the semiconductor layers 12 in the diode chain 11 to have a non-equidistant grid in which, for example, the individual semiconductor layers 12 have a decreasing grid size toward the edge. In this case, depending on the application, a non-linear reduction in potential, for example a parabolic reduction in potential, can be achieved for the edge termination in the semiconductor body 1.

Figure 2B:
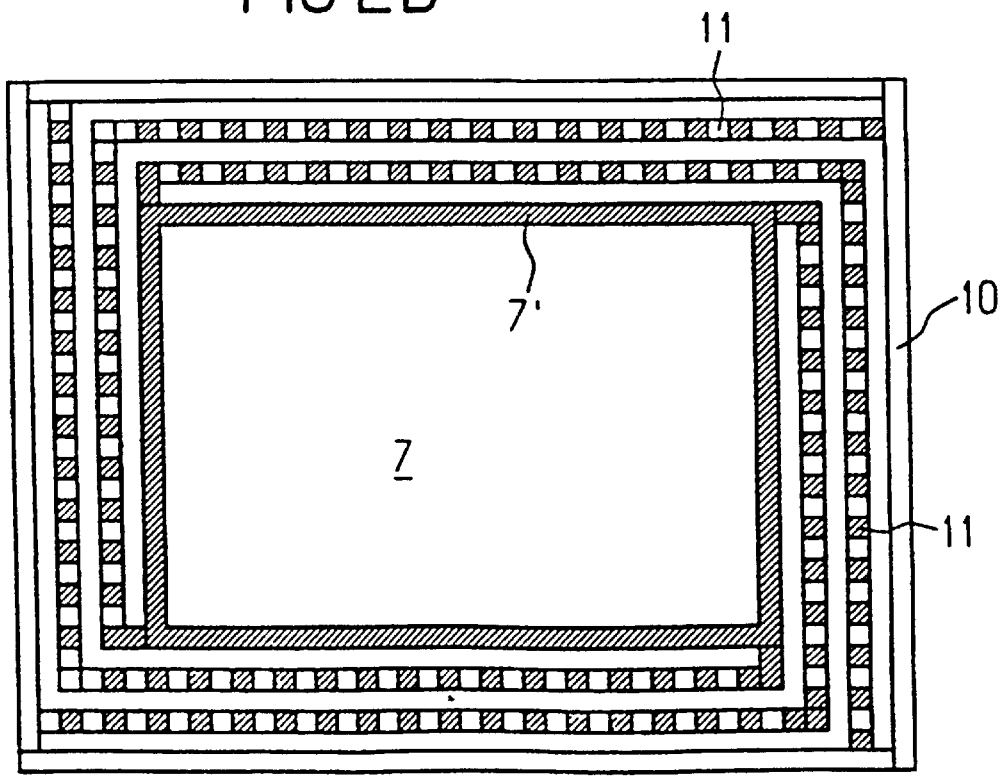

FIGS. 2A and 2B shows the Schottky diode in each of two plan views, in which the diode chains 11 according to the invention are provided in the edge area RB of the semiconductor component. In this case, a single diode chain 11 is provided in FIG. 2A, which is formed from a large number of semiconductor layers 12 disposed at equal intervals and having alternating conductivity types. The single diode chain 11 in this case has a spiral shape in the edge area RB of the semiconductor component, with the distance from the active area AB increasing toward the outside.

FIG. 2B shows the Schottky diode in which a total of four diode chains 11 disposed in a spiral shape are provided in the edge area RB of the semiconductor component. In both FIG. 2A and FIG. 2B, the diode chains 11 are connected to the anode metallization 7 and to the substrate contact electrode 10.

In the exemplary embodiment shown in FIGS. 1 and 2, the edge termination is provided having one or more of the diode chains 11 disposed in a spiral shape. The diode chains 11 may, of course, also be provided in any other way, for example by one or more meandering, or staggered diode chains 11, or diode chains 11 interleaved in one another in some other way.

The use of one or more diode chains 11 having a large number of the semiconductor layers 12 which are disposed in the edge area RB of a semiconductor component makes it possible to reduce the potential in the edge area RB in steps and in a defined manner. In particular, the use of diode chains 11 interleaved in one another in a spiral shape, a meandering shape or in some other way in the edge area RB, allows the edge area RB to be reduced to a minimal area in a high-blocking-capability semiconductor component of this generic type.

With regard to the configuration, the structure and the method of operation of such diode chains 11, reference is made to U.S. Pat. No. 5,486,718, which was mentioned initially, and whose entire contents are incorporated by reference herein.

FIG. 3 shows a partial section of the semiconductor component in the form of the Schottky diode, in which a number of the diode chains 11 with field plates 13 disposed in between are provided as the edge termination.

In comparison to that in FIG. 1, the Schottky diode in FIG. 3 has an edge termination in which a number of the diode chains 11, three in the present exemplary embodiment, are provided, which are kept at a distance from one another. Here, two adjacent diode chains 11 are in each case connected to one another via the field plate 13. The outside diode chains 11 are each connected in a known manner to the anode electrode 7 or the substrate contact electrode 10. The field plates 13 are typically in the form of a metallic interconnect, but they can also be provided by a metal silicide or by polysilicon.

The field plates 13 are disposed in the edge area RB, where the electrical field has a sharply rising profile. As a result of the provision of one or more field plate rings 14 (FIG. 4), it is sufficient to use only a single diode chain 11, which is intended to fix the respective potentials of the field plates. The reverse current in a semiconductor component having field plates 13 and/or field plate rings 14 in its edge area RB can be reduced in a defined manner.

In a development, the various field plates 13 need not necessarily short out two diode chains 11 that are kept at a distance from one another. It would also be feasible for one field plate 13 in each case to be connected to an individual semiconductor layer 12, or to two semiconductor layers 12 adjacent to one another.

Figure 4:
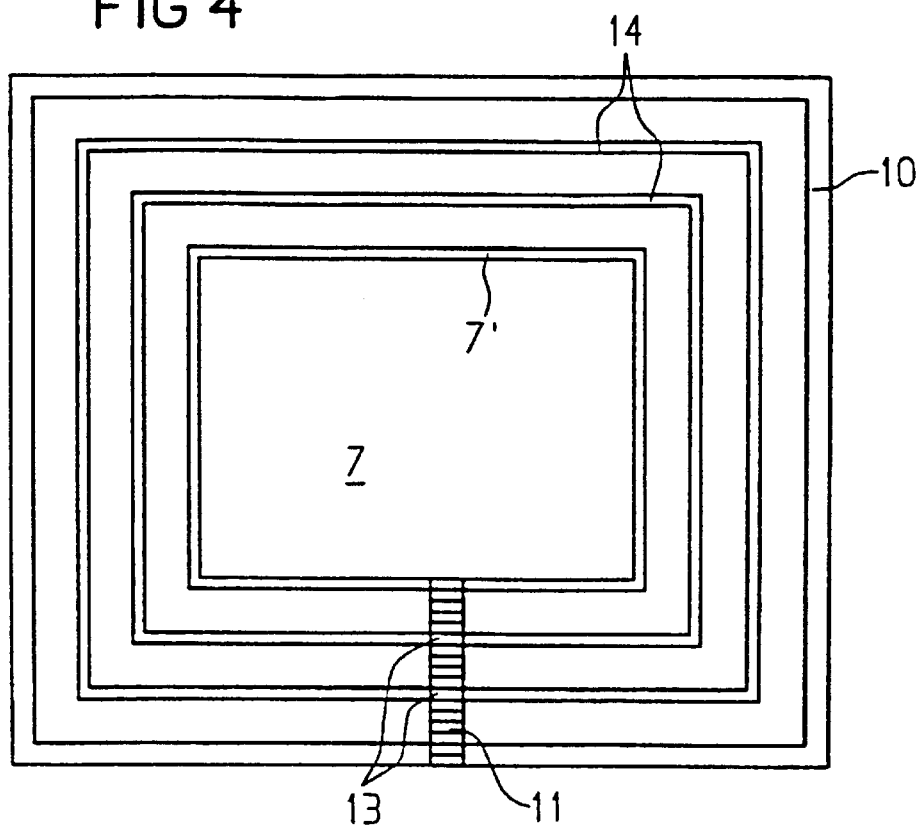

The layout of the SiC Schottky diode in the form shown in FIG. 3 is illustrated in plan view in FIG. 4. The field plates 13 are in this case disposed as concentric interconnects 14, in the form of rings, around the active area AB of the semiconductor component. The particular advantage of these so-called field plate rings 14 is that, in this case, only a single diode chain 11 need be provided between the active area AB and the substrate contact electrode 10, this being required to fix the respective potentials of the field plate rings 14. The field plate rings 14 in this case have the purpose of focusing or channeling the potential lines in the edge area RB of the semiconductor component.

Furthermore, of course, widely differing combinations of the configurations described above are feasible as edge terminations for such SiC semiconductor components, for example floating field rings with or without field plates.

In the above exemplary embodiments, the Schottky diode has a rectangular layout in the plan view shown in FIGS. 2 and 4. However, the present invention is not intended to be limited to such rectangular layouts of semiconductor components but can, in fact, be used for any type of round, oval, hexagonal, triangular or other such layouts.

With regard to the configuration, the structure and the method of operation of edge terminations with the diode chains 11 and the field plate rings 14 disposed between the diode chains 11, reference is made to U.S. Pat. No. 5,266,831, whose entire contents are incorporated by reference herein in the present patent application.

A method for producing the SiC Schottky diodes having the edge termination will be described in the following text with reference to FIGS. 5A–5G.

Figure 5A:
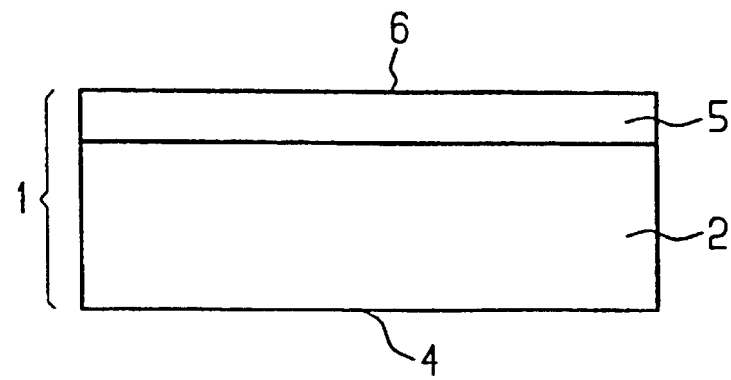
FIGS. 5A–5G are sectional views of a method for producing the SiC Schottky diode according to the invention and having the edge termination, on the basis of various method steps.
Figure 5B:
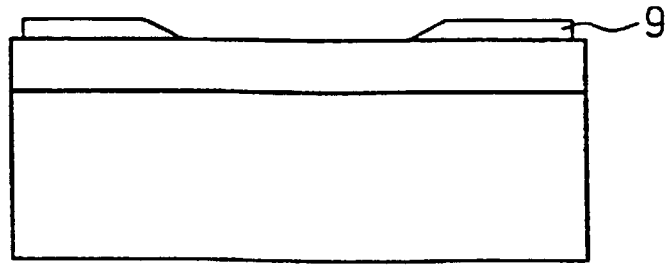

The semiconductor body 1 is provided which contains SiC, and whose inner zone 2 has heavy n-doping. The lightly n-doped epitaxial layer 5 is applied to the surface of the inner zone 2 using an epitaxial process (FIG. 5A). An insulating material 9 is then applied to the second surface 6 of the semiconductor body 1 produced in this way, and is structured in such a way that the insulation layer 9 is produced in the edge area RB (FIG. 5B). The insulating material is advantageously silicon dioxide, but it may also be formed from any other insulation material, for example from silicon nitride.

Figure 5C:
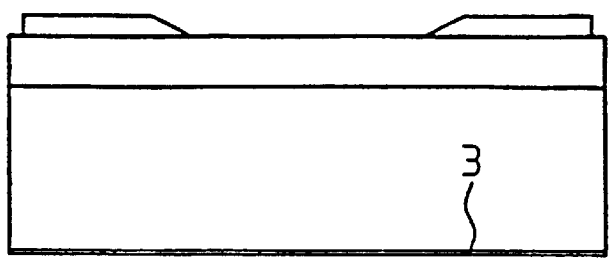
Figure 5D:
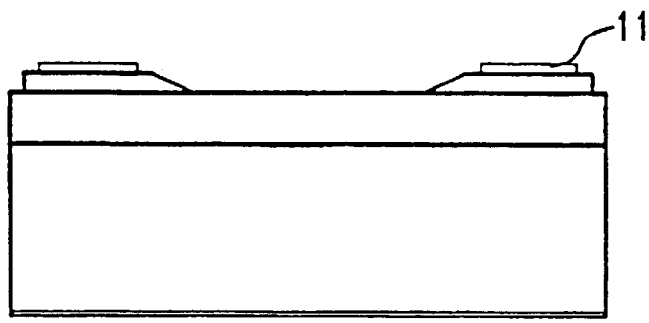
Figure 5E:
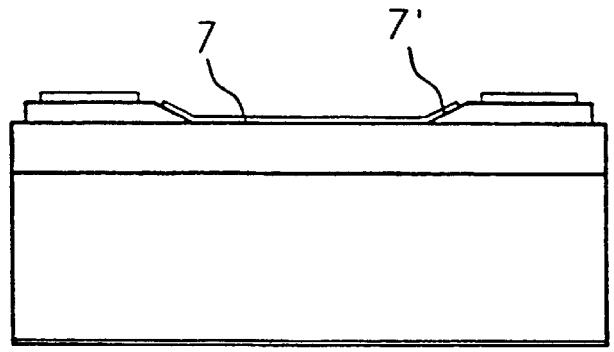
Figure 5F:
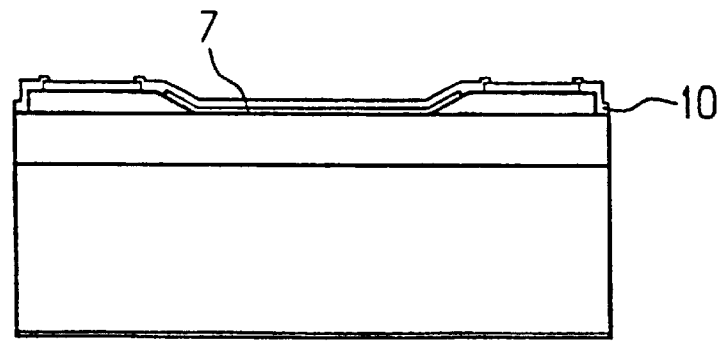
Figure 5G:
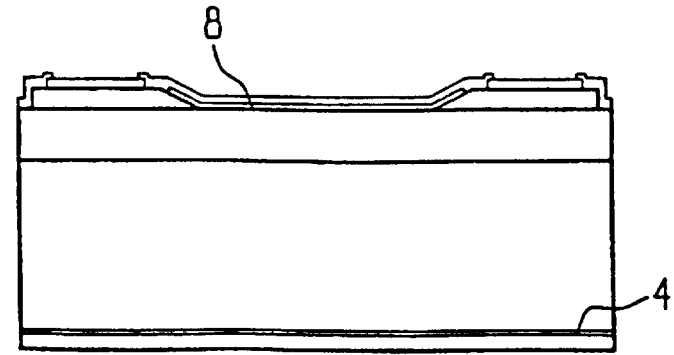

Polysilicon is applied to the insulation layer 9 in the edge area RB of the semiconductor body 1 (FIG. 5D). The polysilicon is structured and implanted in such a way that a large number of the semiconductor layers 12 of alternating conductivity types are produced. Metallization is applied to the second surface 6 of the semiconductor body 1 in order to produce the anode electrode 7 (FIG. 5E). The anode electrode 7 is in this case heat-treated in such a way that the Schottky contact 8 is formed at this point from the interaction of the epitaxial layer 5 and the anode electrode 7. The anode electrode 7 is furthermore structured in such a way that it is connected to one of the semiconductor layers 12 of the diode chain 11. At least one further semiconductor layer 11 is additionally connected to the semiconductor body 1 via the substrate contact electrode 10 (FIG. 5F). The cathode electrode 3, which forms a resistive contact, is applied over a large area to the second surface 4 of the semiconductor body 1 via metallization (FIGS. 5C and 5G).

The method steps mentioned above need not necessarily be carried out in the sequence stated there or in the sequence shown in FIGS. 5A–5G but may also be varied as required for the purposes of process technology.

It is particularly advantageous if at least one of the electrodes 3, 7, 10 has metallization, which is used to improve the electrical characteristics or for reinforcing the contacts. Metal alloys with sufficiently good adhesion characteristics for SiC contain at least a proportion of tungsten, molybdenum, platinum, chromium, titanium, nickel, iron and the like.

Thin contact metallization containing a metal alloy such as that just described is typically applied directly to the semiconductor body 1 first of all to produce a contact with SiC, and is treated at a temperature of about 900° C. The actual metal alloy for the appropriate electrode is then applied to the contact electrode. The metallization which is applied to the thin metallization is used for contact reinforcement, that is to say to improve the capabilities for bonding or soldering the contacts, and to provide good transverse conductivity.

A major advantage of SiC is the capability to grow thermally produced silicon dioxide on the semiconductor body 1. However, this process takes an extremely long time. Because of this, it is advantageous for a thin thermal silicon dioxide to be produced first on the surface 6 of the semiconductor body 1. A field oxide that is produced, for example, by deposition, can then be applied to this thermal oxide.

In the above exemplary embodiments, the edge termination according to the invention has been explained with reference to a Schottky diode. However, it should expressly be stated that the present invention is not exclusively limited to SiC Schottky diodes. In fact, the present invention can also be used with pn diodes, pin diodes, MOSFETs and the like. The edge termination according to the invention is of interest generally for all semiconductor components in which high reverse voltages are relevant.

We claim:

1. A semiconductor component, comprising:
   a semiconductor body formed of silicon carbide;
   an insulation layer disposed on said semiconductor body; and
   an edge termination having at least one diode chain disposed on said insulation layer and thereby being insulated from said semiconductor body, said diode chain having a large number of semiconductor layers formed of alternating conductivity types.

2. In combination with a semiconductor component having a semiconductor body formed of silicon carbide, an edge termination for the semiconductor component, the edge termination comprising:

an insulation layer disposed on the semiconductor body; and at least one diode chain disposed on said insulation layer and thereby being insulated from the semiconductor body, said diode chain having a large number of semiconductor layers formed of alternating conductivity types.

3. The edge termination according to claim 2, wherein said diode chain is a single, continuous chain of mutually adjacent ones of said semiconductor layers formed of said alternating conductivity types.

4. The edge termination according to claim 2, including at least one field plate connected to at least one of said semiconductor layers of said diode chain.

5. The edge termination according to claim 4, wherein the semiconductor body has an active area, and said field plate is one of a plurality of field plates disposed as concentric interconnects, circular rings, around said active area of the semiconductor body.

6. The edge termination according to claim 2, wherein said semiconductor layers of said diode chain have one of an equidistant grid and a non-equidistant grid with a grid size reducing toward an edge of the semiconductor body.

7. The edge termination according to claim 2, wherein said semiconductor layers of said diode chain form a large number of zener diodes.

8. The edge termination according to claim 2, wherein in a lateral projection, said diode chain has at least one of a spiral and a meandering shape, and is interleaved.

9. The edge termination according to claim 2, wherein said semiconductor layers contain at least one of doped polysilicon and doped monocrystalline silicon.

10. A Schottky diode, comprising:

a semiconductor body of a first conductivity type, formed of silicon carbide, and having a first surface and a second surface, said semiconductor layer having a dopant layer of the first conductivity type and a top of said dopant layer defining said first surface of said semiconductor body, said dopant layer having a dopant concentration lower than that of a remainder of said semiconductor body;

a metallic first electrode disposed on said first surface and forms a Schottky contact with said semiconductor body;

a second electrode contacting said semiconductor body on said second surface;

an insulation layer disposed on said first surface of said semiconductor body;

a reference ground potential terminal; and an edge termination having at least one diode chain disposed on said insulation layer and thereby being insulated from said semiconductor body, said diode chain having a large number of semiconductor layers formed of alternating conductivity types, said diode chain connected to the first electrode and to said reference-ground potential terminal.

11. The Schottky diode according to claim 10, wherein said diode chain is a single, continuous chain of mutually adjacent ones of said semiconductor layers having said alternating conductivity types.

12. The Schottky diode according to claim 11, wherein said reference ground potential terminal is at a cathode potential of the Schottky diode.

13. The Schottky diode according to claim 10, including at least one field plate connected to at least one of said semiconductor layers of said diode chain.

14. The Schottky diode according to claim 13, wherein said semiconductor body has an active area, and said field plate is one of a plurality of field plates disposed as concentric interconnects, circular rings, around said active area of said semiconductor body.

15. The Schottky diode according to claim 10, wherein said semiconductor layers of said diode chain have one of an equidistant grid and a non-equidistant grid with a grid size reducing toward an edge of said semiconductor body.

16. The Schottky diode according to claim 10, wherein said semiconductor layers of said diode chain form a large number of zener diodes.

17. The Schottky diode according to claim 10, wherein in a lateral projection, said diode chain has at least one of a spiral and a meandering shape, and is interleaved.

18. The Schottky diode according to claim 10, wherein said semiconductor layers contain at least one of doped polysilicon and doped monocrystalline silicon.

* * * * *